(12) United States Patent
Kang

(10) Patent No.: US 7,531,855 B2
(45) Date of Patent: May 12, 2009

(54) MULTI-CHIP DEVICE AND METHOD FOR MANUFACTURING THE SAME

(75) Inventor: Hee Bok Kang, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 77 days.

(21) Appl. No.: 11/525,160

(22) Filed: Sep. 22, 2006

(65) Prior Publication Data

US 2007/0197025 A1   Aug. 23, 2007

(30) Foreign Application Priority Data

Feb. 17, 2006  (KR) .................... 10-2006-0015660

(51) Int. Cl.
  *H01L 31/62* (2006.01)
(52) U.S. Cl. ............................. 257/290; 257/E25.032
(58) Field of Classification Search ................ 438/637; 257/444, 290
  See application file for complete search history.

(56) References Cited

U.S. PATENT DOCUMENTS

| 5,451,977 | A  | * | 9/1995  | Kusuda et al. ................ 345/44 |
| 6,829,155 | B2 |   | 12/2004 | Kang |
| 6,845,031 | B2 |   | 1/2005  | Kang et al. |
| 2005/0218313 | A1 | * | 10/2005 | Kuroda .................. 250/231.13 |

FOREIGN PATENT DOCUMENTS

KR   2001-0010654   2/2001

* cited by examiner

*Primary Examiner*—Brook Kebede
*Assistant Examiner*—Tony Tran
(74) *Attorney, Agent, or Firm*—Finnegan, Henderson, Farabow, Garrett & Dunner, L.L.P.

(57) ABSTRACT

A multi-chip device includes LED sensors for sensing light separated by a predetermined interval in a wafer, LEDs for emitting light formed over the wafer respectively corresponding to the LED sensors, a driving circuit formed between the LEDs over the wafer, an insulating film over the wafer, and trenches in the insulating film exposign the LEDs.

7 Claims, 8 Drawing Sheets

MULTI-CHIP DEVICE AND METHOD FOR MANUFACTURING THE SAME

RELATED APPLICATION

This application is based upon and claims the benefit of priority to Korean Application No. KR10-2006-0015660, filed on Feb. 17, 2006, the entire contents of which are incorporated herein by reference.

BACKGROUND

1. Technical Field

The present invention generally relates to a multi-chip device and a method for manufacturing the same, and more specifically, to a technology of transmitting a signal through light with an LED (Light Emitting Diode) element and an LED sensor to reduce design and manufacturing cost.

2. Description of the Related Art

A circuit generally includes several chips bonded together with connections provided therebetween. The chips may be bonded by a flip chip process or by a wire bonding process. However, with the wire bonding process, a length of the wire connecting the chips reaches several millimeters, resulting in significant signal delays. As a result, the number of chips that can be bonded together is limited.

Recently, a technology of forming through-hole electrodes through a chip to provide a signal transmission path has been developed. Particularly, after a circuit is formed on a wafer, the wafer is polished to less than 100 µm, and through-holes are formed through the wafer and then coated with metal to form connection electrodes. Thousands of through-hole electrodes may be formed in one chip in this manner, and several chips may be interconnected in a single package.

After chips are formed with the through-hole electrodes, the chips can be connected at certain points with the shortest path. Therefore, the through-hole electrodes through the chips have eliminated the limit of the number of chips that can be bonded together through wire bonding.

Alternative methods for forming connections between a plurality of chips have been developed. For example, when a plurality of chips include small-sized inductors and capacitors for providing transmission through electromagnetic or electrostatic coupling, wireless coupling between the chips may be a substitute for wire bonding or through-hole electrodes.

Techniques for forming circuits in semiconductor chips are key to high performance, low power consumption, and low cost of the circuits. When features of the elements in the circuits become miniaturized, a line delay increases as a result of increased parasitic capacitance, thereby affecting the performance of the circuits. The increase of line delay time may be reduced by using materials having a small dielectric constant as interlayer insulating films or inserting a repeater into a path. However, the repeater increases leakage current and power consumption of the chip.

SUMMARY

Various embodiments consistent with the present invention are directed at transmitting a signal through light with a LED (Light Emitting Diode) element and a LED sensor to reduce design and manufacturing cost.

Consistent with embodiments of the present invention, a multi-chip device includes LED sensors for sensing light formed separated by a predetermined interval in a wafer, LEDs for emitting light formed over the wafer respectively corresponding to the LED sensors, a driving circuit formed between the LEDs over the wafer, an insulating film over the wafer, and trenches in the insulating film exposign the LEDs.

Consistent with embodiments of the present invention, a multi-chip device includes a plurality of chips. The chips include LED sensors for sensing light separated by a predetermined interval in a wafer and configured to sense light; LEDs for emitting light formed over the wafer respectively corresponding to the LED sensors; a driving circuit over the wafer; an insulating film over the wafer; and trenches in the insulating film exposing the LEDs.

Consistent with embodiments of the present invention, there is also provided a method for manufacturing a multi-chip device. The method includes forming LED sensors for sensing light separated by a predetermined interval in a wafer; forming LEDs for emitting light over the wafer respectively corresponding to the LED sensors; forming a driving circuit between the LED elements over the wafer; forming an insulating film over the wafer; and forming trenches in the insulating film to expose the LEDs through a selective etching process.

Consistent with embodiments of the present invention, there is further provided a method for manufacturing a multi-chip device having a plurality of chips. The chips are formed by forming LED sensors for sensing light separated by a predetermined interval in a wafer; forming LEDs for emitting light over the wafer respectively corresponding to the LED sensors; forming a driving circuit between the LED elements over the wafer; forming an insulating film over the wafer; and forming trenches exposing the LEDs through a selective etching process.

BRIEF DESCRIPTION OF THE DRAWINGS

Other aspects and advantages will become apparent upon reading the following detailed description and upon reference to the drawings in which.

DETAILED DESCRIPTION OF THE EXEMPLARY EMBODIMENTS

FIGS. 1a through 1g are cross-sectional diagrams illustrating a method for manufacturing a chip to be packaged in a multi-chip device consistent with the present invention.

Figure 1A:
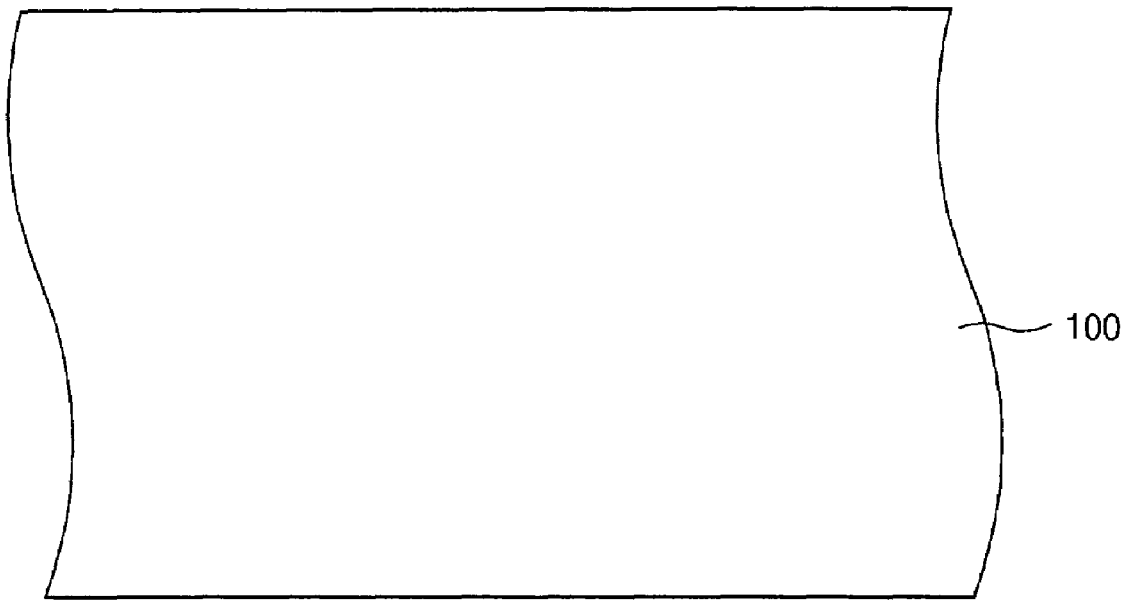
FIGS. 1a through 1g are cross-sectional diagrams illustrating a method for manufacturing a chip to be packaged in a multi-chip device consistent with the present invention.

FIG. 1a shows a wafer 100 before devices are formed thereon. Although not shown, the wafer 100 includes first regions in which a driving circuit is to be formed and second regions in which LEDs and LED sensors are to be formed.

Figure 1B:
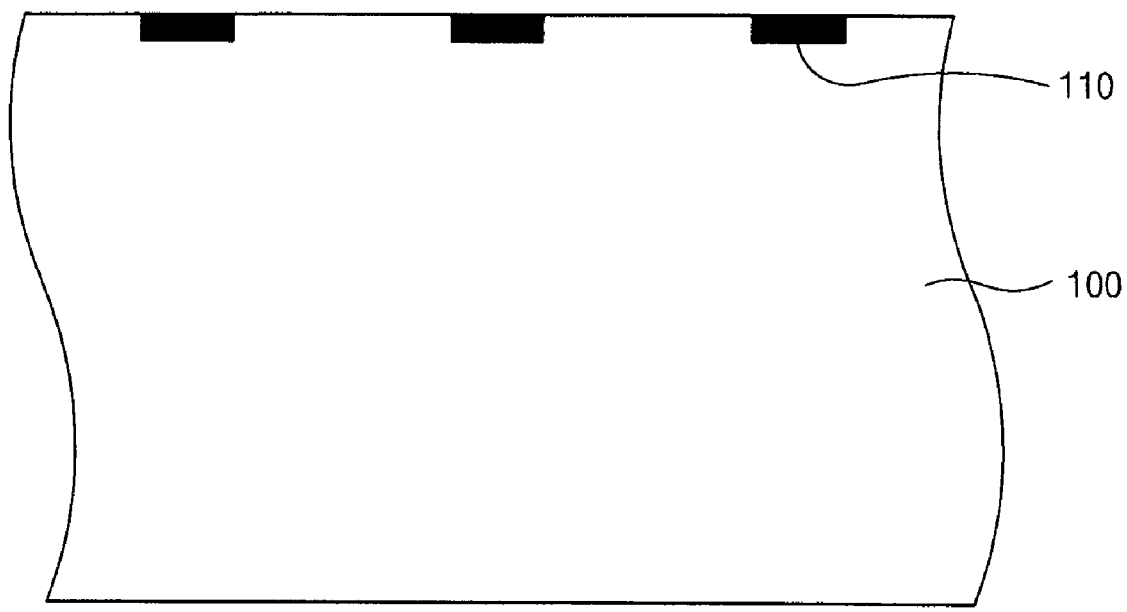

Referring to FIG. 1b, LED sensors 110 are formed and separated by a predetermined interval in the wafer 100.

Figure 1C:
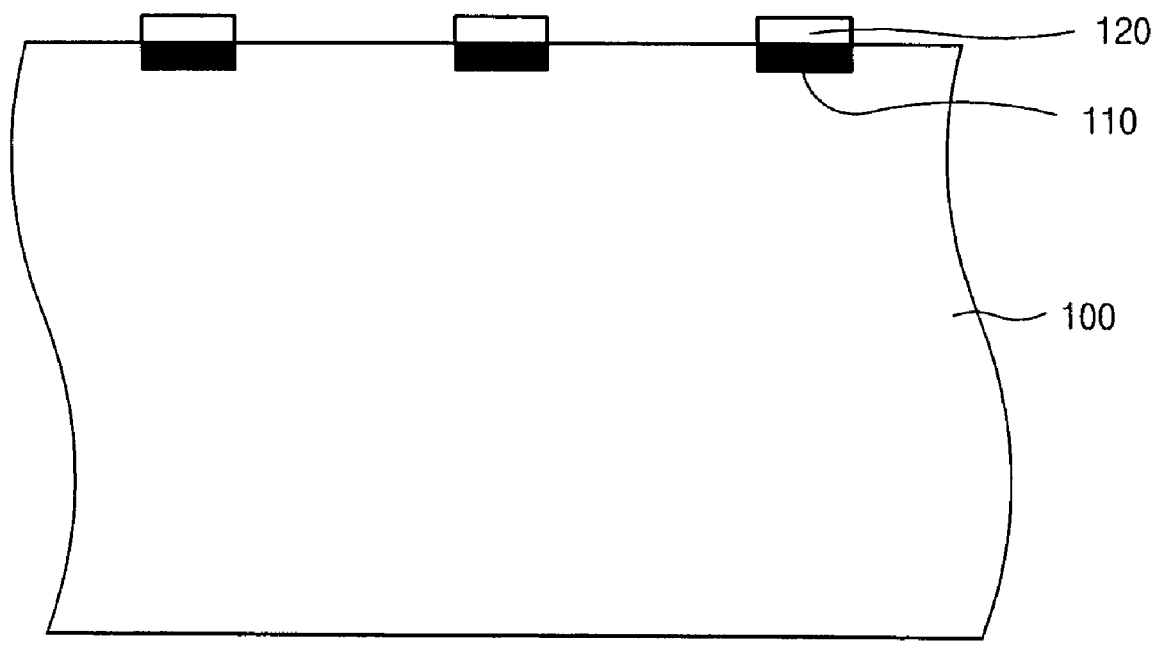

Referring to FIG. 1c, LEDs 120 are formed on the wafer 100 and separated by the predetermined interval and are connected to the LED sensors 110. The LEDs 120 may comprise PN diodes, and the LED sensors 110 may comprise photo diodes for sensing light generated from the LEDs 120. The LED sensors 110 and the LEDs 120 may be formed by a general diode process such as a CMOS process.

Figure 1D:
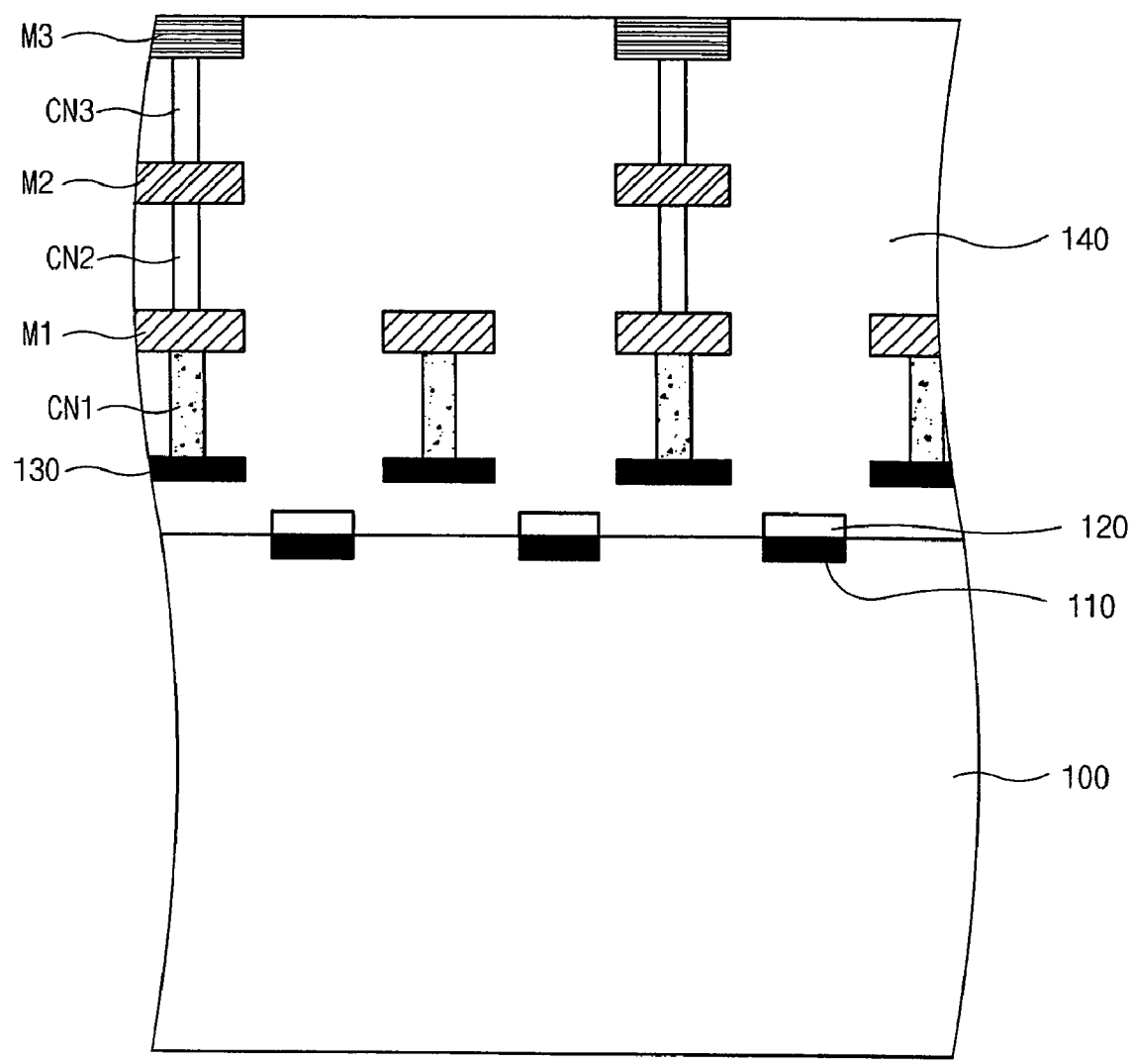

Referring to FIG. 1d, the driving circuit includes circuit elements such as MOS transistors. For example, FIG. 1d shows CMOS gates 130 formed over the wafer 100 in the CMOS region. Although not shown in the figure, other device components are generally formed below the CMOS gates 130, such as gate dielectric layers. An insulating film 140 is formed over the entire surface of the resultant structure including the wafer 100, the LED sensors 110, the LEDs 120, and the CMOS gates 130. FIG. 1d also shows multiple layers of metal contacts may be formed in the insulating film 140 to provide connections to the CMOS gates 130. For example, FIG. 1d shows first contact nodes CN1 formed over the CMOS gates 130, first metal layers M1 connected to the CMOS gates 130 through the contact nodes CN1, second contact nodes CN2 formed over the first metal layers M1, second metal layers M2 connected to the first metal layers M1 through the contact nodes CN2, third contact nodes CN3 over the second metal layers M2, and third metal layers M3 connected to the second metal layers M2 through the contact nodes CN3.

Although FIG. 1d shows only the insulating film 140 as one layer, it is to be understood that frequently multiple insulating films are formed during the process of forming the multiple layers of metal contacts.

The driving circuit including CMOS gates 130 and the metal layers M1~M3 is coupled to the LEDs 120 and the LED sensors 110 to drive the LEDs 120 and also to receive signals from the LED sensors 110. The LEDs 120 receive electric signals from the driving circuit including the CMOS gate 130 and the metal layers M1~M3 and generate light signals, which are detected by the LED sensors 110. The LED sensors 110 detect and amplify the light signals emitted by the LEDs 120 to recreate the data carried in the light signals.

Figure 1E:
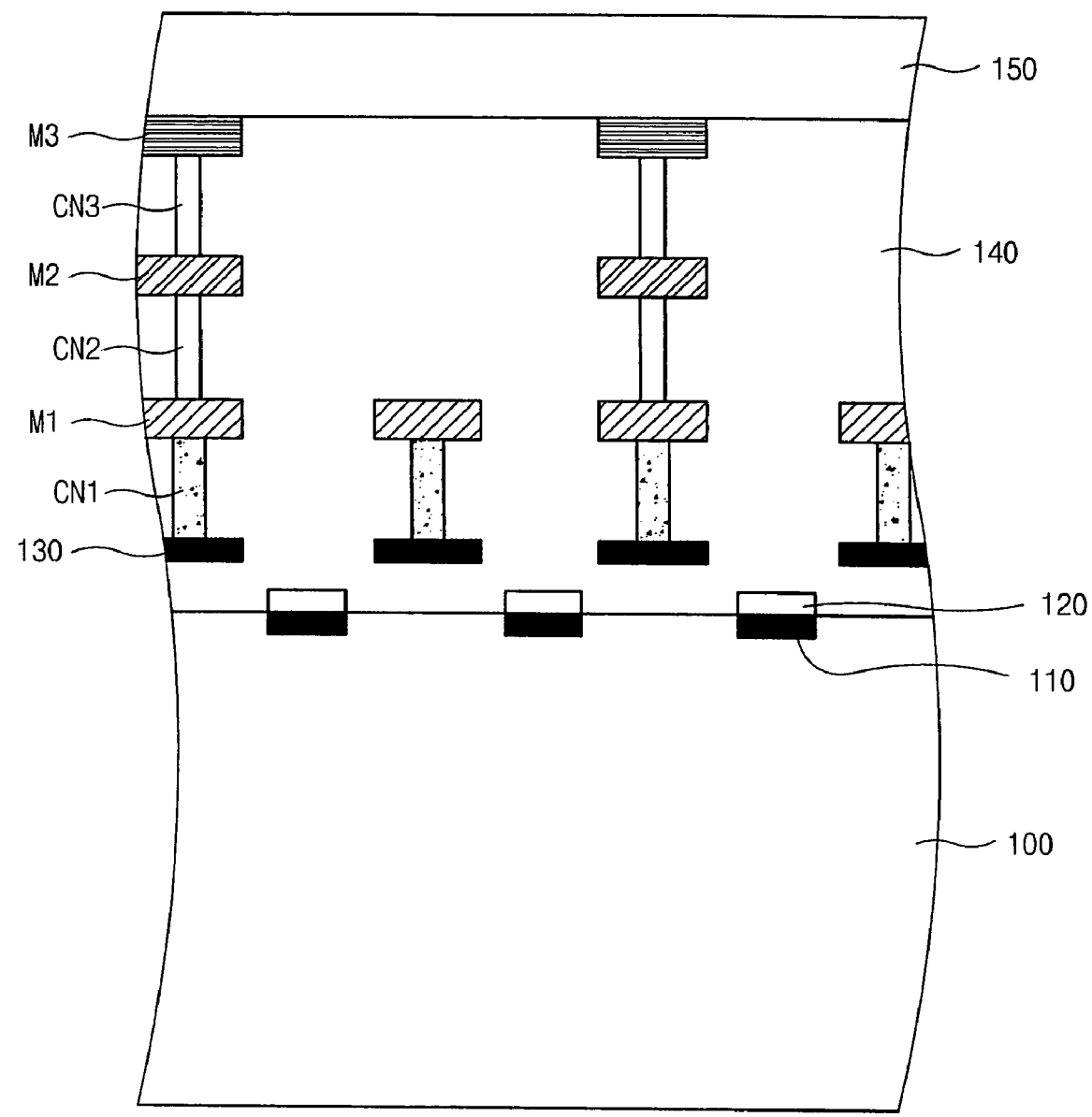

Referring to FIG. 1e, a passivation layer 150 for protecting the driving circuit is formed over the third metal layers M3.

Figure 1F:
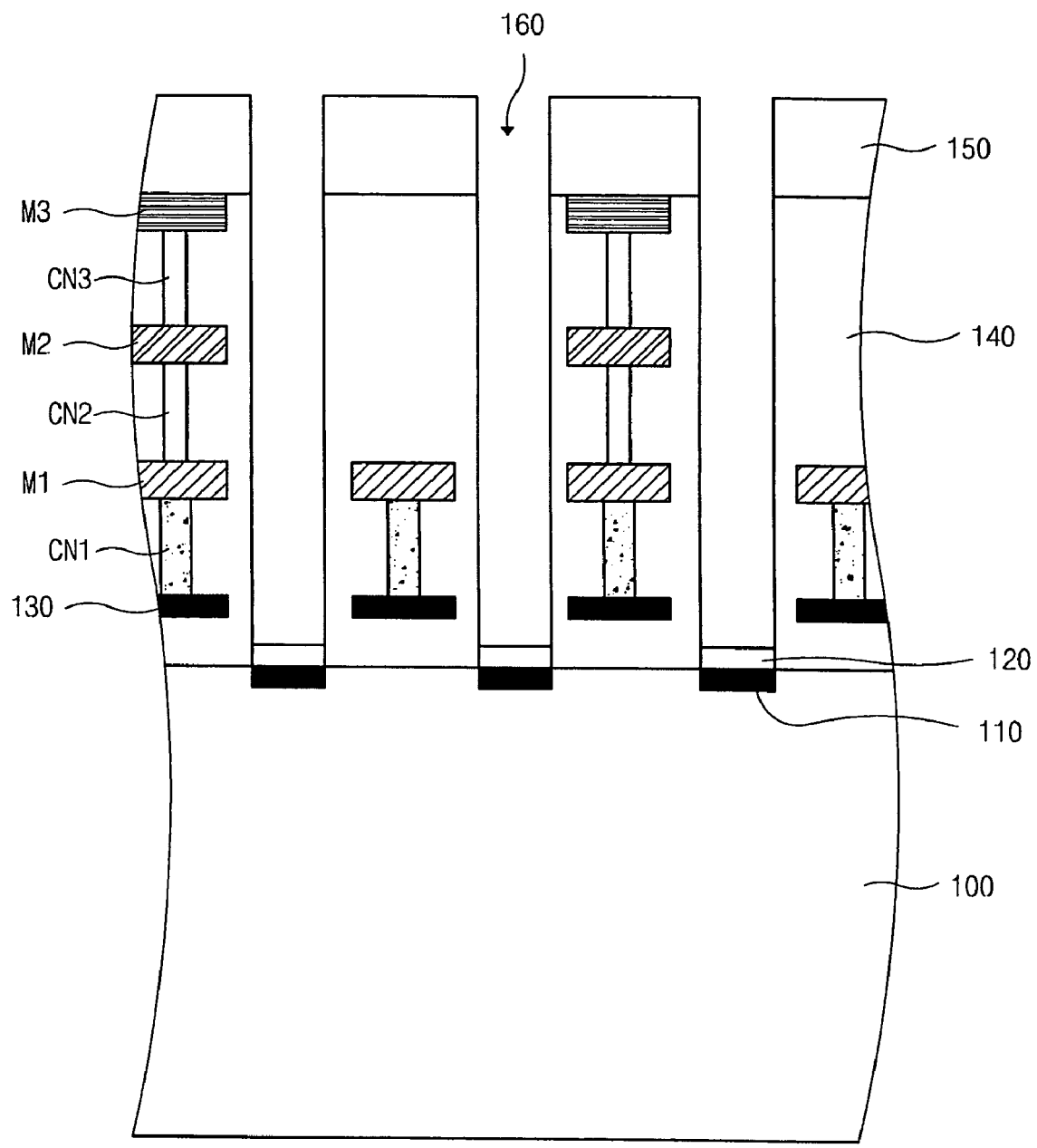

Referring to FIG. 1f, the insulating film 140 and the passivation layer 150 are selectively etched to form trenches 160 for exposing the LEDs 120 wafer. The trenches 160 constitute light transmission paths between chips to be bonded subsequently.

Figure 1G:
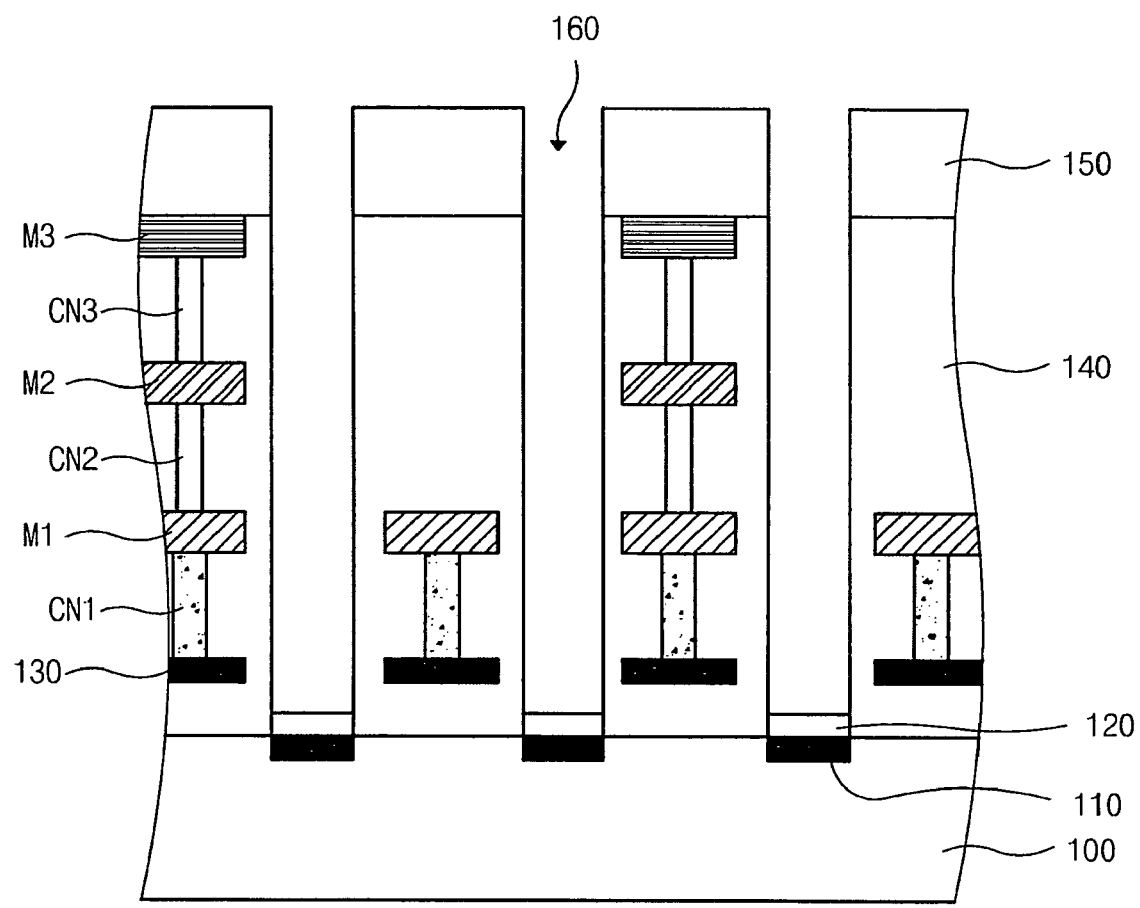

Referring to FIG. 1g, the wafer 100 is etched to have a predetermined thickness by a back-grinding etching process. In one aspect, the back side of the wafer 100 is etched to have a thickness sufficient for the light generated by the LEDs 120 to be transmitted therethrough.

Figure 2:
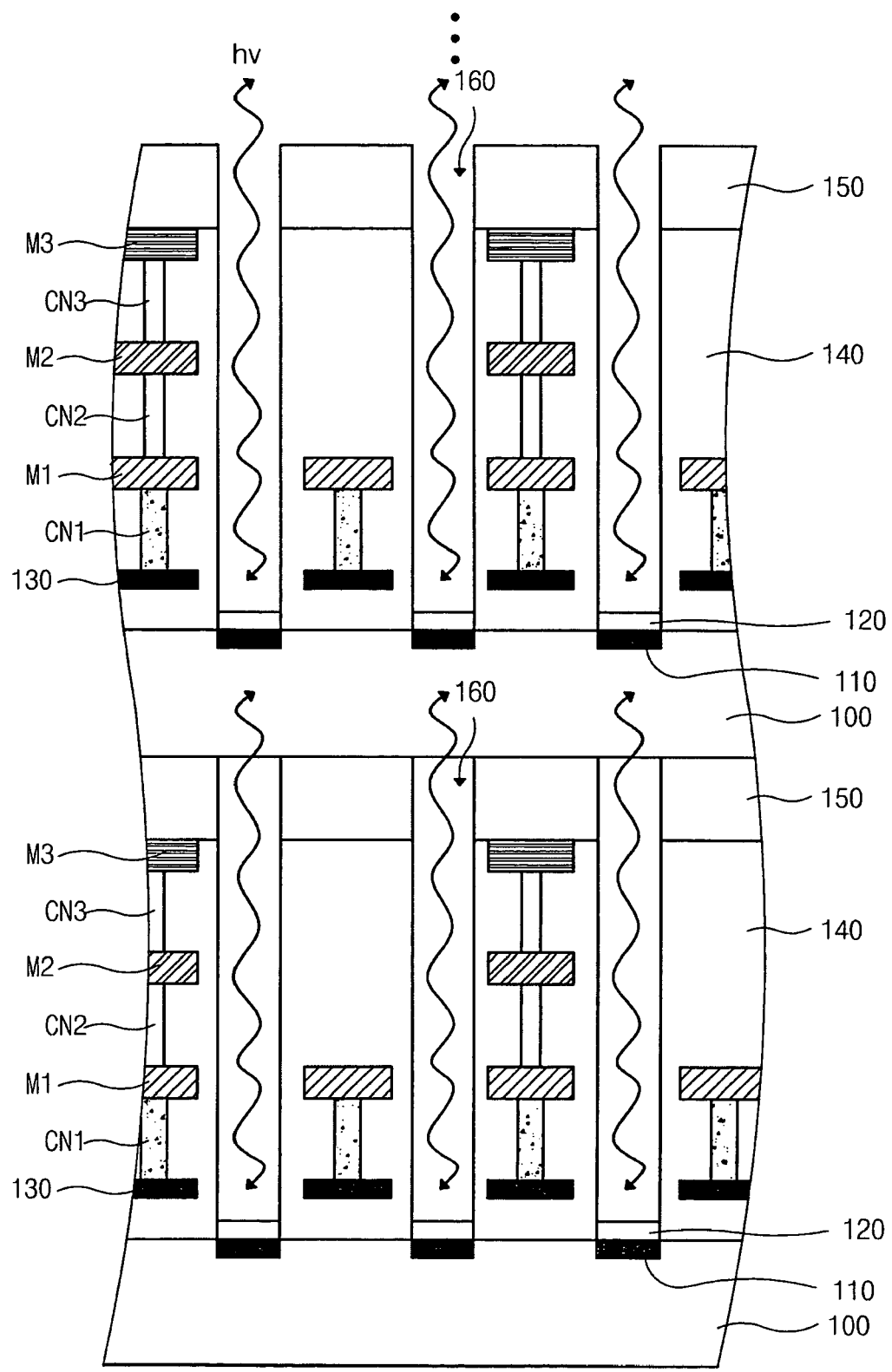
FIG. 2 is a cross-sectional diagram illustrating a multi-chip device consistent with the present invention.

FIG. 2 is a cross-sectional diagram illustrating a multi-chip device consistent with the present invention. The multi-chip device includes chips formed by the method illustrated in FIGS. 1a-1g. As shown in FIG. 2, the chips in the multi-chip device are interconnected through light emission by the LEDs 120 and light detection by LED sensors 110. More specifically, signals are transmitted with light hv passing through the trenches 160 between the chips. The LEDs 120 in one chip emit light that travels both upward and downward and the LED sensors 110 also detect the light hv emitted by the LEDs 120 in both directions. Therefore, signals can be sent in both ways.

As described above, a multi-chip device consistent with the present invention includes LEDs and LED sensors for transmitting signals over light to reduce design and manufacturing cost.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A multi-chip device, comprising:
a first chip including a first wafer, a first light sensor formed in the first wafer, a first light-emitting device formed over the first wafer, and a first trench for exposing the first light-emitting device; and
a second chip including a second wafer, a second light sensor formed in the second wafer stacked over the first chip and for sensing an optical signal emitted from the first light-emitting device, a second light-emitting device formed over the second wafer, and a second trench for exposing the second light-emitting device,
wherein the optical signal is transmitted to the second light sensor through the first trench and the second wafer; and
wherein the first trench transfers the optical signal to an undersurface of the second wafer.

2. The device of claim 1, wherein the first light sensor is formed in the area in which the upper-surface of the first wafer is etched to a predetermined depth.

3. The device of claim 1, wherein the first light-emitting device is formed over the first light sensor.

4. The device of claim 1, wherein the first chip further includes a first driving circuit formed over the first wafer except the area of the first trench and for outputting an electric signal to the first light-emitting device to generate the optical signal.

5. The device of claim 4, wherein the first chip further includes a first passivation layer formed over the first driving circuit.

6. The device of claim 1, wherein the second chip further includes a second driving circuit formed over the second wafer except the second trench and for receiving sensing data from the second light sensor.

7. The device of claim 6, wherein the second chip further includes a second passivation layer formed over the second driving circuit.

* * * * *